United States Patent
Takahashi

(10) Patent No.: US 6,563,209 B1
(45) Date of Patent: May 13, 2003

(54) LEAD FRAME FOR SEMICONDUCTOR DEVICE

(75) Inventor: Yoshiharu Takahashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/629,900

(22) Filed: Jul. 31, 2000

(30) Foreign Application Priority Data

Sep. 6, 1999 (JP) ............................ 11-251308

(51) Int. Cl.[7] ..................... H01L 23/48; H01L 23/495
(52) U.S. Cl. .................. 257/692; 257/666; 257/676
(58) Field of Search ........................... 257/672, 690, 257/692, 735, 666, 676; 438/111, 123

(56) References Cited

U.S. PATENT DOCUMENTS

| 5,648,682 | A | * | 7/1997 | Nakazawa et al. | .......... 257/673 |
| 6,691,241 | | * | 11/1997 | Kazutaka | .................... 437/206 |

FOREIGN PATENT DOCUMENTS

| JP | 2-240940 | 9/1990 |
| JP | 10-56122 | 2/1998 |
| JP | 10-178044 | 6/1998 |
| JP | 11-74404 | 3/1999 |

* cited by examiner

Primary Examiner—Olik Chaudhuri
Assistant Examiner—DiLinh Nguyen
(74) Attorney, Agent, or Firm—Leydig, Voit & Mayer, Ltd.

(57) ABSTRACT

A lead frame for a semiconductor device using the lead frame as a wiring base member includes a plate-like body having a non-planar upper surface and a planar under surface. The plate-like body includes a first thin portion for mounting a semiconductor chip having pad electrodes, first thick portions radially arranged around the first thin portion for forming lead electrodes respectively corresponding to the pad electrodes, a second thin portion located between pairs of the first thick portions, a third thin portion peripherally surrounding the first thick portions, and a second thick portion surrounding the third thin portion. The first, second, and third thin portions have substantially the same thickness. A concave part having a circumferential portion is defined by the thin portions, and a projecting part is defined by the thick portions.

8 Claims, 11 Drawing Sheets

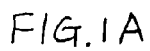
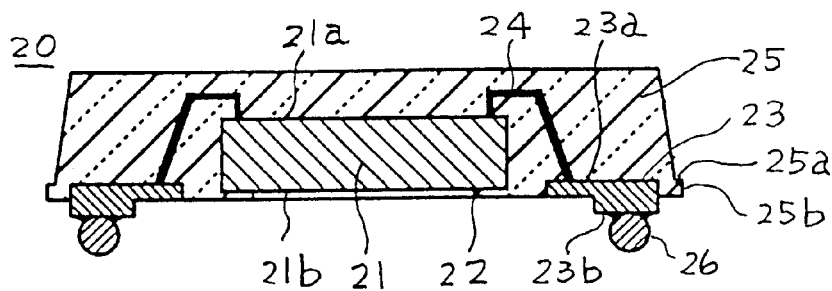
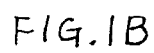
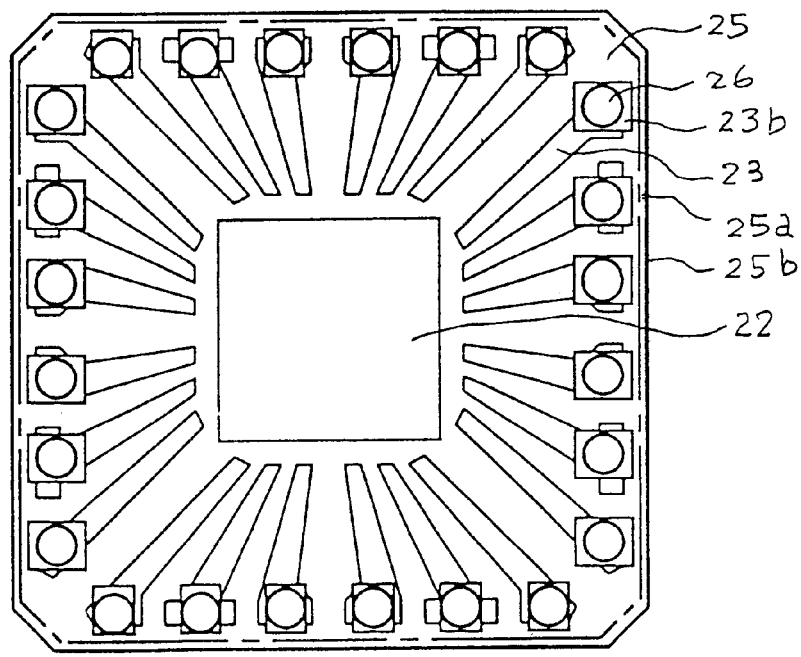

LEAD FRAME FOR SEMICONDUCTOR DEVICE

BACKGROUND OF THE INVENTION

1. Field of the Invention

The present invention relates to a lead frame for use in a semiconductor device.

2. Description of the Background Art

Hitherto, it has been popular to use a QFP (Quad Flat Package) type semiconductor device in which external leads are arranged on four sides of a semiconductor device using a lead frame as a wiring base member. Recently, under the background of high density integration of semiconductor chips, multiple pins are arranged in the semiconductor device, and instead of the QFP type semiconductor device, a ball grid array (Ball Grid Array, hereinafter referred to as BGA) type semiconductor device in which external leads are arranged over a surface, and a non lead (Quad Non Lead Package, hereinafter referred to as QFN) type semiconductor device have been increasingly used. Generally, in the BGA type semiconductor device, a printed circuit board is popularly used as a wiring base member. However, in such a conventional BGA type semiconductor device, a wiring line is connected by way of a through hole, which is a high-priced structure. Therefore, recently a BGA type semiconductor device and a QFN type semiconductor device using a low-priced lead frame as a wiring base member have been put into practical use.

A semiconductor device using a conventional lead frame a wiring base member is hereinafter described with reference to the accompanying drawings. FIG. 9A is a sectional view showing a construction of a conventional BGA type semiconductor device disclosed in the Japanese Laid-Open Patent Publication (unexamined) No. Hei. 11-74404, and FIG. 9B is a bottom view of the semiconductor device shown in FIG. 9A. FIG. 10A is a plan view showing a lead frame used in the conventional BGA type semiconductor device and arranged in a single line. FIG. 10B is a sectional view taken along the line Xb—Xb indicated by the arrows in FIG. 10A. FIG. 10C is a sectional view taken along the line Xc—Xc indicated by the arrows in FIG. 10A.

In FIGS. 9A, 9B, 10A, 10B and 10C, the conventional BGA type semiconductor device uses a lead frame 50 as a wiring base member, and a semiconductor chip 1 provided with a pad electrode is mounted on a die pad 2 with a junction material 3. The semiconductor device has a soldering ball mounting portion (hereinafter referred to as external electrode portion) 4. A lead electrode 5 of which an inside end portion is arranged proximate the die pad 2 and a pad electrode of the semiconductor chip 1 are connected to each other through a connecting lead 6 and sealed with a resin layer 7. Portions 4a and 4b continued underneath the lead electrode 5 are made thin by etching, except the external electrode portion 4. Accordingly, the die pad 2, the external electrode portion 4 and a suspension lead 8 for supporting the die pad 2 are exposed on the same surface as the under surface of the resin layer 7. A soldering ball 9 is mounted on the external electrode portion 4, and an end of the lead electrode 5 and that of the suspension lead 8 are finally cut along the resin seal line 7a.

A manufacturing method is hereinafter described with reference to FIGS. 9 to 11C. FIGS. 11A, 11B and 11C are explanatory views showing a manufacturing method of the conventional BGA type semiconductor device using a conventional type lead frame as a wiring base member. FIG. 11A is a sectional view of the lead frame shown in FIG. 10C. FIG. 11B is a sectional view showing molds applied at the time of sealing with the resin layer. FIG. 11C is a sectional view showing an assembling step before mounting the soldering ball has completed.

First, the lead frame 50 shown in FIGS. 10A, 10B and 10C is manufactured. More specifically, after forming a resist film not shown on the upper surface 50a and the under surface 50b of the lead frame 50 and patterning it as shown in FIG. 10A, it is etched from the upper surface 50a and the under surface 50b. Thus, the die pad 2, the external electrode portion 4, the lead electrode 5, the suspension lead 8 and a dam bar 50c are formed and continue one another across openings 50d and 50e. Then, after forming a resist film (not shown) on to the under surface 50b side of the lead frame 50, except the portions 4a and 4b on the underside of the lead electrode 5, the portions 4a and 4b are formed by half etching.

Subsequently, the semiconductor chip 1 provided with the pad electrode is mounted on the die pad 2 by applying the junction material 3. The pad electrode of the semiconductor chip 1 and the inside end of the lead electrode 5 are then connected through the connection lead 6. Then, as shown in FIG. 11B, after mounting a lower mold 10 in contact with the die pad 2 and the external electrode portion 4, an upper mold 11 is positioned to the resin seal line 7A and mounted on the upper surface of the lead frame 50. After tightening the two molds 10 and 11, the semiconductor chip 1, the die pad 2, the lead electrode 5 and the connecting lead 6 are sealed with the seal resin layer 7 by transfer molding. Thereafter, when removing the upper mold 11 and the lower mold 10, a non lead type semiconductor device, before mounting the soldering ball 9, is obtained, as shown in FIG. 11C.

Then, by applying a soldering paste to the external electrode portion 4, the soldering ball 9 is mounted on the external electrode portion 4. When the lead electrode 5 protruding from the resin sealing line 7a, and the seal resin layer 7 gets into the underside portions 4a and 4b of the lead electrode 5 that is thin, are cut along the resin seal line 7a with a cutter, the conventional BGA type semiconductor device shown in FIGS. 9A and 9B is obtained.

In the mentioned semiconductor device using the conventional lead frame as the wiring base member, since the die pad 2, the external electrode portion 4, the lead electrode 5, the suspension lead 8 and dam bar 50c are continuous across the openings 50d and 50e, when sealed with the seal resin layer 7 after mounting the two molds 10 and 11, the molten resin having a low viscosity is formed also in the opening portion 50d. As a result, there has been a problem that the resin molten intrudes into a small space between contact surfaces, where the die pad 2, the external electrode portion 4, the suspension lead 8 are in contact with the lower mold 10, and comes to form a thin resin film (hereinafter referred to as thin burr).

It is certainly possible to prevent the thin burr formed between the external electrode portion 4 and the lower mold 10 if contact pressure between the external electrode portion 4 and the lower mold 10 is large. However, the lead electrode 5 is thin and supported like a cantilever at a part held between the lower mold 10 and the upper mold 11 at the position of the resin seal line 7a. Therefore, if the external electrode portion 4 is pressed by the lower mold 10, the lead electrode 5 is deformed by the pressure. As a result, it has been heretofore impossible to secure a contact pressure capable of preventing the formation of the thin burr between the external electrode portion 4 and the lower mold 10.

The formation of the thin burr varies depending on the degree of roughness in surface finishing (hereinafter referred to as surface roughness) of the contact surface where the die pad 2 and the external electrode portion 4 are in contact with the lower mold 10. Generally, the thin burr does not adhere to any die or mold having a good surface roughness, but adheres to the die pad 2, the external electrode portion 4, etc. having poor surface roughness. Therefore, it is necessary to remove the thin burr adhered, for example, to the external electrode portion 4. To remove the thin burr, hydraulic pressure trimming, chemical trimming, chemical and hydraulic pressure trimming, etc. are performed, and after removing the thin burr, it is necessary to perform treatments such as washing, drying, etc., and, as a result, manufacturing cost is high.

There has been another problem that the lead electrode 5 protruding from the resin seal line 7a, the seal resin layer 7 in the portions 4a and 4b made thin by half etching, and the suspension lead 8, are cut using a cutter along the resin seal line 7a. Therefore, it is easy to cause a failure in cutting the portion of the seal resin layer 7 in the portion 4b. As a result, the resin seal a line 7a is not linear but has a complicated crushed configuration, resulting in a defective product.

SUMMARY OF THE INVENTION

The present invention was made to solve the above-discussed problems and has an object of providing a lead frame for a semiconductor device capable of preventing the production of a thin burr on the surface of the lead frame in contact with the lower mold, for example, between the die pad or the external electrode portion and the lower mold.

Another object of the invention is to provide a semiconductor device capable of preventing the cutout portion of the seal resin layer of the semiconductor device from having a complicated crushed configuration.

A lead frame for semiconductor device according to the invention includes a plate-like body having an uneven upper surface and a plain under surface, and the plate-like body includes a first thin portion for mounting a semiconductor chip provided with a plurality of pad electrodes, a plurality of first thick portions provided around the first thin portion for forming lead electrodes respectively arranged corresponding to the pad electrodes of the semiconductor chip, a second thin portion provided between the plurality of first thick portions, a third thin portion provided for surrounding the plurality of first thick portions, and a second thick portion provided around the third thin portion. Accordingly, it is possible to form a concave part in the first, second and third thin portions on the upper surface side of the lead frame.

As a result, in the manufacture of the semiconductor device using such a lead frame as a wiring base member, by removing the first, second and third thin portions by etching, the circumferential portion of the mentioned concave part of the lead frame is connected to the circumferential portion of the semiconductor device including the semiconductor chip, the lead electrode, the seal resin layer, etc. provided in the concave part. Under such a condition, by extruding the semiconductor device from the under surface side of the lead frame, it is possible to separate easily the semiconductor device from the lead frame without using any cutter. It is further possible to prevent the separated portion between the lead frame and the semiconductor device 20 from being a complicated crushed configuration.

It is preferable that the first, second and third thin portions have substantially the same thickness. As a result of such arrangement, the under surface side of the lead frame can be formed into an integrated one component over the first, second and third thin portions. Therefore, in the manufacture of the semiconductor device using the lead frame as a wiring base member, when the under surface side of the lead frame comes in full contact with a lower mold and seals with the seal resin layer, the seal resin layer is shut off by the first, second and third thin portions. Consequently, there is no seal resin layer flowing in the portion where the under surface of the lead frame and the lower mold are in contact with each other, and it is possible to prevent the production of thin burr.

It is preferable that the lead frame for semiconductor device includes a plate-like body having an uneven upper surface and a plain under surface, and the plate-like body includes a first thin portion for mounting a semiconductor chip provided with a plurality of pad electrodes, a plurality of first thick portions provided around the first thin portion to form lead electrodes respectively arranged corresponding to the pad electrodes of the semiconductor chip, a second thin portion provided between the plurality of first thick portions, a third thin portion provided for surrounding the plurality of first thick portions, a second thick portion provided around the third thin portion to form an auxiliary electrode, a fourth thin portion provided around the second thick portion, and a third thick portion provided around the fourth thin portion. Accordingly, it is possible to form a concave part on the upper surface side of the lead frame in the first, second and third thin portions, and to arrange the second thick portion provided to form the auxiliary electrode around the concave part.

As a result, in the manufacture of the semiconductor device using the lead frame as a wiring base member, by removing the first, second, third and fourth thin portions by etching, the semiconductor device including the semiconductor chip, lead electrodes, seal resin layer, etc. provided in the concave part is separated from the lead frame at the circumferential portion of the semiconductor device. Consequently, it is possible to separate automatically the semiconductor device from the lead frame. Thus, it is easy to separate the semiconductor device from the lead frame without using any cutter. It is further possible to prevent the separated portion between the lead frame and the semiconductor device from being a complicated crushed configuration.

It is further preferable that the first, second, third and fourth thin portions have substantially the same thickness. As a result of such arrangement, the under surface side of the lead frame can be formed into an integrated one component over the first, second, third and fourth thin portions. Accordingly, in the manufacture of the semiconductor device using the lead frame as a wiring base member, the under surface side of the lead frame can be formed into an integrated one component over the first, second, third and fourth thin portions. Therefore, in the manufacture of the semiconductor device using the lead frame as a wiring base member, when the under surface side of the lead frame comes in full contact with a lower mold and seals with the seal resin layer, the seal resin layer is shut off by the first, second, third and fourth thin portions. Consequently, there is no seal resin layer flowing in the portion where the under surface of the lead frame and the lower mold are in contact with each other, and it is possible to prevent the production of thin burr.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1A is a sectional view showing an arrangement of a semiconductor device using a lead frame as a wiring base member according to a first preferred embodiment of the present invention, and FIG. 1B is a bottom view of the semiconductor device shown in FIG. 1A.

FIG. 3A is a sectional view showing that a semiconductor chip mounted on the lead frame formed with a thin portion and a lead electrode is electrically connected to the lead electrode. FIG. 3B is a sectional view showing that an upper mold and a lower mold are applied to seal with a resin. FIG. 3C is a sectional view showing that a resist film for etching is applied to form an external electrode portion. FIG. 3D is a sectional view showing that the external electrode portion is protruded by etching. FIG. 3E is a sectional view showing that a conductive ball is mounted on the external electrode portion.

FIG. 8A is a sectional view showing that a semiconductor chip mounted on the lead frame formed with a thin portion, a lead electrode and an auxiliary electrode is electrically connected to the lead electrode. FIG. 8B is a sectional view showing that an upper mold and a lower mold are applied to seal with a resin. FIG. 8C is a sectional view showing that a resist film for etching is applied to form an external electrode portion. FIG. 8D is a sectional view showing that the external electrode portion is protruded by etching.

FIG. 11A is a sectional view of the lead frame shown in FIG. 10C. FIG. 10B is a sectional view showing that molds are applied at the time of sealing with the seal resin layer. FIG. 11C is a sectional view showing that an assembling step before mounting the soldering ball has completed.

DETAILED DESCRIPTION OF THE PREFERRED EMBODIMENTS

A semiconductor device according to a first preferred embodiment of the present invention and a manufacturing method thereof are hereinafter described.

Figure 2A:
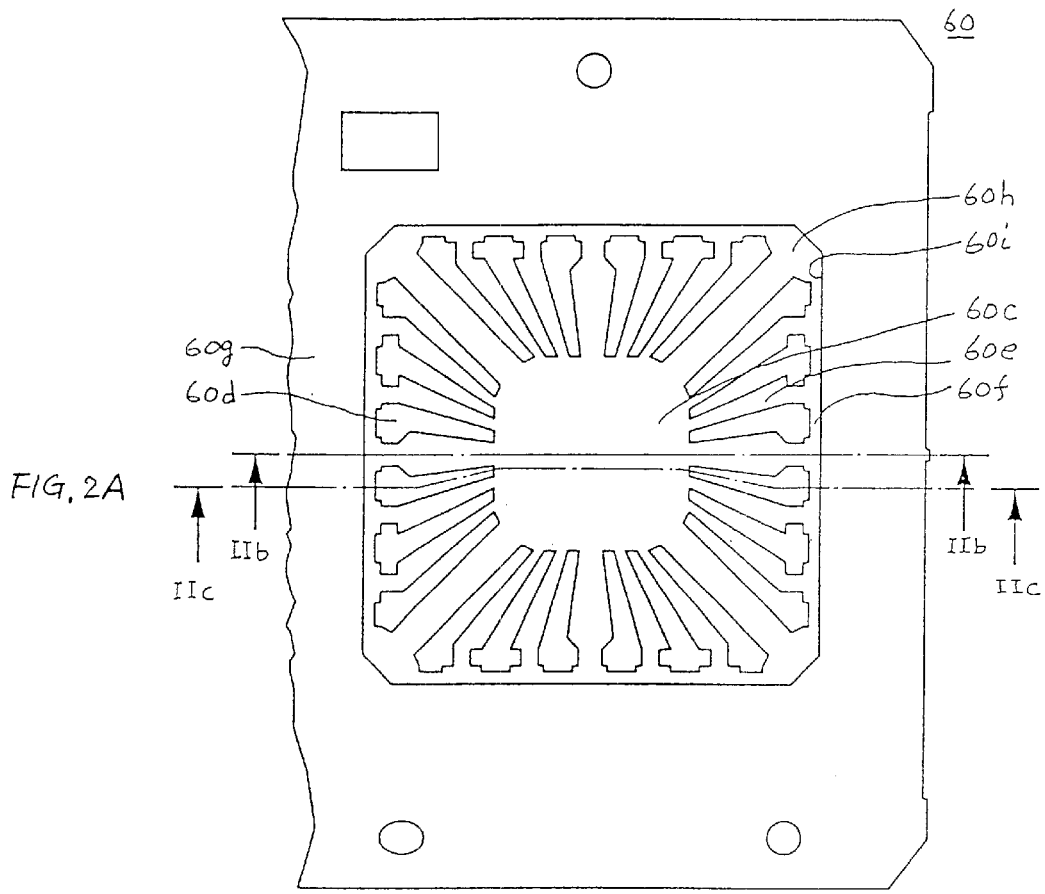
FIG. 2A is a plan view of lead frames according to the first preferred embodiment of the present invention.
Figure 2B:
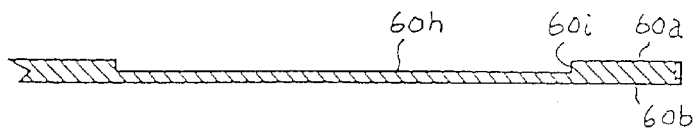
FIG. 2B is a sectional view taken along the line IIb—IIb indicated by the arrows in FIG. 2A.
Figure 2C:
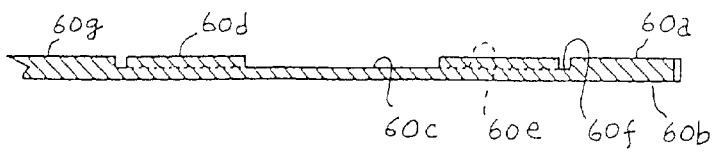
FIG. 2C is a sectional view taken along the line IIc—IIc indicated. by the arrows in FIG. 2A.

FIG. 1A is a sectional view showing a construction of a semiconductor device using a lead frame as a wiring base member, and FIG. 1B is a bottom view of the semiconductor device shown in FIG. 1A. FIG. 2A is a plan view of a lead frame arranged in a single line and used as a wiring base member according to this first preferred embodiment. FIG. 2B is a sectional view taken along the line IIb—IIb indicated by the arrows in FIG. 2A. FIG. 2C is a sectional view taken along the line IIc—IIc indicated by the arrows in FIG. 2A.

Configuration of a lead frame 60 is hereinafter described. As shown in FIGS. 2A, 2B and 2C, the lead frame 60 is composed of a conductive plate-like body such as copper and having an non-planar upper surface 60a and a planar under surface 60b. This plate-like body includes a central first thin portion 60c for mounting a semiconductor chip 21 provided with a plurality of pad electrodes (not shown), a plurality of first thick portions 60d radiating from the first thin portion 60c for forming lead electrodes 23 respectively corresponding to the pad electrodes of the semiconductor chip 21, a second thin portion 60e provided between pairs of the plurality of first thick portions 60d, a peripheral third thin portion 60f surrounding the plurality of first thick portions 60d, a second thick portion 60g surrounding the third thin portion 60f. Further, the first thin portion 60c, the second thin portion 60e and the third thin portion 60f have substantially the same thickness. Those thin portions 60c, 60e and 60f form a concave part 60h having a peripheral edge 60i. The thick portions 60d and 60g form a projecting part.

Using such a lead frame 60, a semiconductor device 20 shown in FIGS. 1A and 1B is obtained. The semiconductor device 20 has an upper surface 21a and an under surface 21b, and the semiconductor chip 21 having the plurality of pad electrodes (not shown) is mounted on the first thin portion 60c of the lead frame 60 through a junction material 22 (not shown). The plurality of lead electrodes 23 extending peripherally on the under surface 21b side of the semiconductor chip 21 are arranged correspond to the plurality of pad electrodes. A connecting lead 24 serving as connecting means makes a connection between the plurality of pad electrodes and the plurality of lead electrodes 23. Each of the plurality of lead electrodes 23 includes a thin internal lead portion 23a having a connection part to the connecting lead 24 on the upper surface side, and a thick external electrode portion 23b protruding toward the under surface and forming a connection part to outside.

The semiconductor chip 21, the lead electrodes 23 and the connecting lead 24 are integrally sealed with a resin layer 25. This resin layer 25 has an underside which is substantially the same surface as the under surface of the internal lead portion 23a of the lead electrodes 23, and the external electrode portion 23b protrudes downward from the underside of the resin layer. A conductive ball 26 is mounted on the external electrode portion 23b.

In the lead frame 60 (not shown), the thin portion of the lead frame is removed by etching as described hereinafter, and finally the lead frame 60 is separated along the peripheral portion 60i of the concave part 60h of the lead frame 60. Thus, the semiconductor device 20 shown in FIGS. 1A and 1B is obtained.

Figure 3A:
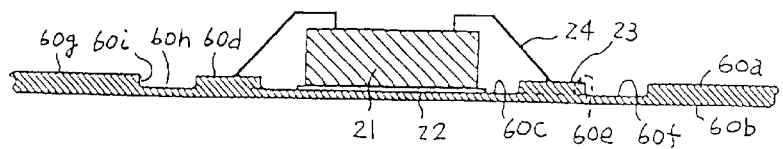
FIGS. 3A to 3E are explanatory views showing a manufacturing method of the semiconductor device using a lead frame as a wiring base member according to the first preferred embodiment of the invention.
Figure 3B:
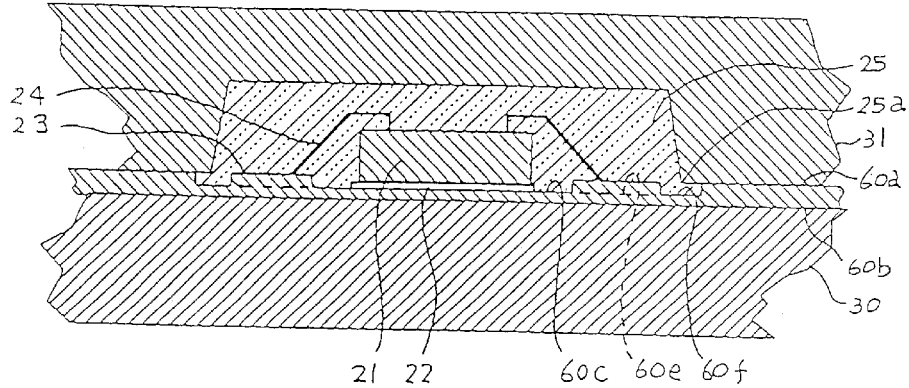
Figure 3C:
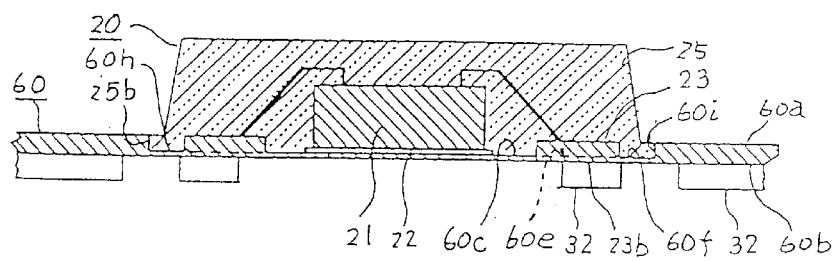
Figure 3D:
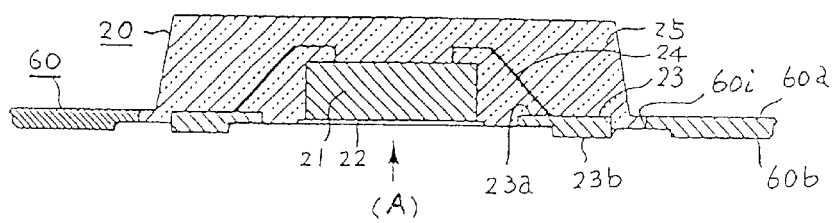
Figure 3E:
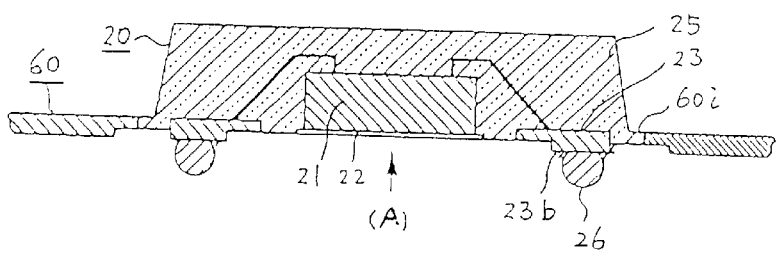

Now, a method of manufacturing the semiconductor device is described with reference to FIGS. 1A to 3E. FIGS. 3A to 3E are explanatory views showing a manufacturing method of the semiconductor device using a lead frame as a wiring base member according to the first preferred embodiment of the present invention. FIG. 3A is a sectional view showing a semiconductor chip mounted on the lead frame formed with a thin portion and a lead electrode is electrically connected to the lead electrode. FIG. 3B is a sectional view showing an upper mold and a lower mold are applied to inject a resin. FIG. 3C is a sectional view showing a resist film for etching applied to form an external electrode portion. FIG. 3D is a sectional view showing the external electrode portion protruding due to etching. FIG. 3E is a sectional view showing a conductive ball mounted on the external electrode portion.

First, by half etching the upper surface 60a of the lead frame 60, after forming a resist film (not shown) and patterning it as shown in FIG. 2A, a plate-like body provided with the non-planar upper surface 60a and the planar under surface 60b is formed. More specifically, the first thin portion 60c for mounting the semiconductor chip 21 provided with the plurality of pad electrodes (not shown), the plurality of first thick portions 60d radially arranged around the first thin portion 60c for forming the lead electrodes 23 respectively corresponding to the pad electrodes of the semiconductor chip 21, the second thin portion 60e between pairs of the plurality of first thick portions 60d, the third thin portion 60f peripherally surrounding the plurality of first thick portions 60d, and the second thick portion 60g surrounding the third thin portion 60f are formed.

Further, the first thin portion 60c, the second thin portion 60e and the third thin portion 60f have substantially the same thickness, and those thin portions 60c, 60e and 60f form the concave part 60h. The thick portions 60d and 60g form the projecting part. Thus, the plate-like body provided with the non-planar upper surface 60a and the planar under surface 60b is formed.

In the sectional form of the peripheral portion 60i of the concave part 60h formed in the direction of thickness by etching, a smooth surface is naturally formed, spreading out a little from the third thin portion 60f toward the upper surface 60a of the lead frame due to side etching peculiar to this etching. As a result, it becomes easy to separate the peripheral portion 25b of a later-described seal resin layer 25 from the peripheral portion 60i of the concave part 60h of the lead frame 60.

The peripheral portion 60i may be formed either to be larger than a resin seal line 25a, for example, to be larger by a depth of the concave part 60h or to be coincident with the resin seal line 25a, so that a later-described upper mold 31 is easily positioned.

Then, as shown in FIG. 3A, by applying a junction material 22 composed of epoxy resin, epoxy resin with silver, adhesive tape, solder or the like to the central part of the first thin portion 60c, the semiconductor chip 21 is mounted (junction step).

Thereafter, the semiconductor chip 21 is connected to the lead electrodes 23 using the connecting lead 24 composed of gold wire, aluminum wire or the like (connection step).

Then, as shown in FIG. 3B, the under surface 60b of the lead frame 60 the which the junction step and the connection step have been completed, is mounted on the lower mold 30. Then, the upper mold 31 is positioned to the resin seal line 25a and mounted on the upper surface 60a of the lead frame 60. After tightening the two molds 30 and 31, the thermosetting resin layer 25 composed of epoxy resin, phenol resin or the like is transformed to a liquid of a low viscosity and injected with high pressure by transfer molding (sealing step).

At this time, the under surface 60b side of the lead frame 60 being integrated with the thin portions 60c, 60e and 60f comes entirely in contact with the lower mold 30, and the seal resin layer 25 is excluded by the thin portions 60c, 60e and 60f. Therefore, the seal rein layer 25 does not flow in the contact surface between the under surface 60b of the lead frame 60 and the lower mold 30. As a result, it is possible to prevent formation of thin burr.

After the sealing step, the two molds 30 and 31 are removed. And as shown in FIG. 3C, on the under surface 60b of the lead frame 60, a resist film 32 is applied to a part where the external electrode portion 23b is formed and to a part surrounding the outside of the peripheral portion 60i of the concave part 60h. Then the under surface 60b of the lead frame 60, except the portions covered with the resin film 32, is removed by half etching up to the same surface as the under surface of the seal resin layer 25. As a result, as shown in FIG. 3D, the junction material 22 is exposed, and the plurality of lead electrodes 23 protrude respectively toward the under surface. Thus, the thick external electrode portion 23b serving as a connection part appears on the underside of the lead electrodes 23 (formation step of external electrode portion).

That is, the semiconductor chip 21, the lead electrodes 23 and the connecting lead 24 are integrally sealed with the seal resin layer 25. This seal resin layer 25 is arranged so that its underside forms substantially the same surface as the under surface of the internal lead portion 23a of the lead electrodes 23, and the external electrode portion 23b protrudes downward from the underside of the seal resin layer 25. The lead frame 60 and the semiconductor device 20 are connected at the area where the peripheral portion 25b of the seal resin layer 25 lies in a line with the peripheral portion 60i of the concave part 60h of the lead frame 60.

Under such a condition, by pushing the semiconductor device 20 in the direction of arrow (A) shown in FIG. 3D, the semiconductor device 20 is separated from the lead frame 60 (separation step). As a result, it is possible to separate easily the semiconductor device 20 and the lead frame 60 without using any cutter, and it is further possible to prevent the separated portion of the seal resin layer 25 of the semiconductor device 20 from having a complicated crushed configuration.

Even if a thin burr is formed in the space between the upper mold 31 and the lead frame 60, the thin burr can be removed in this separation step.

Further, the semiconductor device obtained after this separation step can be used in a thin and small apparatus, such as cellular phone, as a non lead type semiconductor device.

Further, before the separation step, as shown in FIG. 3E, a soldering paste is applied to the external electrode portion 23b (not shown) to connect a conductive ball 26, such as a soldering ball. Thereafter, by pushing the semiconductor device 20 in the direction of the arrow (A) at the part where the semiconductor device 20 and the peripheral portion 60i of the lead frame 60 are connected, the semiconductor device 20 is separated from the lead frame 60. Thus, a BGA type semiconductor device as shown in FIGS. 1A and 1B is obtained.

That is, in this manufacturing method, as a result of using the lead frame 60 as a wiring base member, it is possible to achieve the BGA type semiconductor device by adding the step of mounting the conductive ball before the separation step for obtaining the non lead type semiconductor device. This means that both non lead type semiconductor device and BGA type semiconductor device are obtained in the common manufacturing process, thus it is possible to establish an efficient manufacturing line.

Though a semiconductor device in which the lead frame 60 in the form of strip as shown in FIGS. 2A, 2B and 2C is used as a wiring base member in the first preferred embodiment of the invention, it is also preferable to use a lead frame in the form of continues hoop. In such a modification, the same function and advantage as the foregoing are also exhibited.

Though an example in which one semiconductor chip 21 is mounted on the lead frame 60 and a plurality of the thick portion 60d for providing the lead electrodes 23 are arranged around it, and a plurality of such lead frames are arranged in a single line is described in this embodiment, it is also preferable that, from the viewpoint of efficient manufacture, a plurality of semiconductor chips 21 are mounted. In such a modification, the same function and advantage as the foregoing are also exhibited.

Figure 4A:
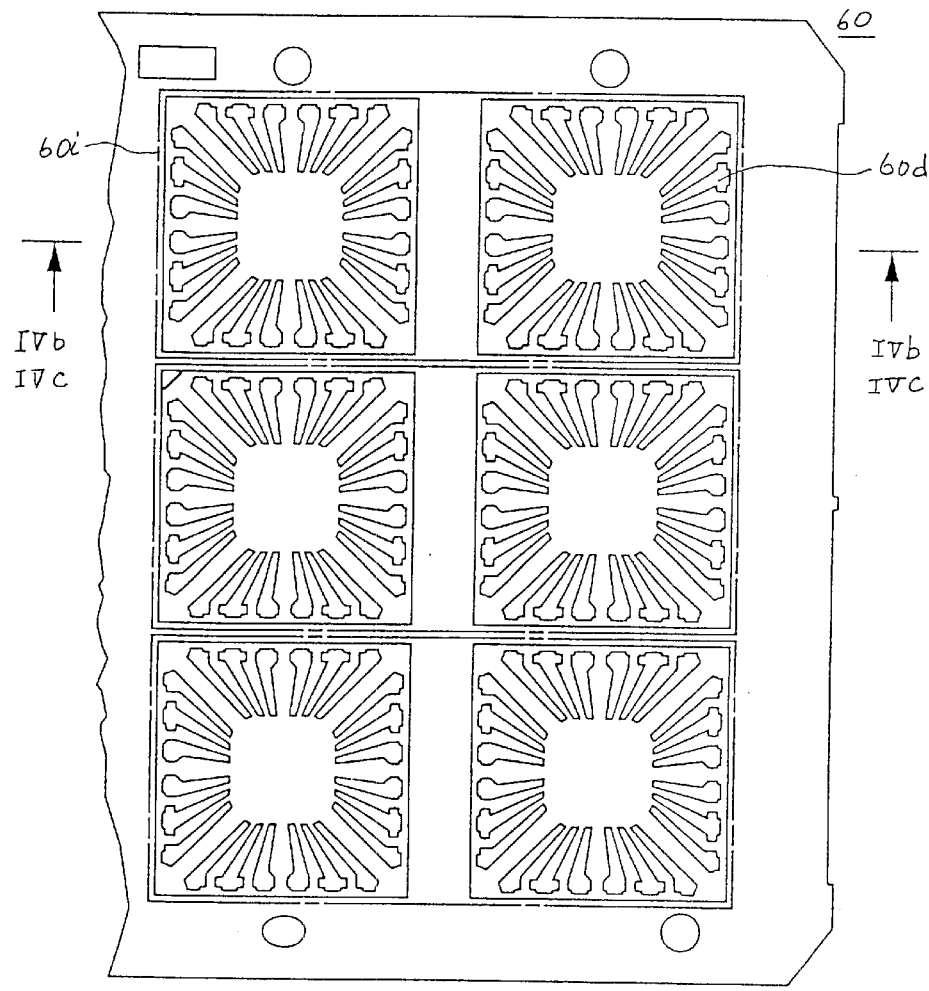
FIG. 4A is a plan view of the lead frame used as another wiring base member according to the first preferred embodiment of the invention.
Figure 4B:
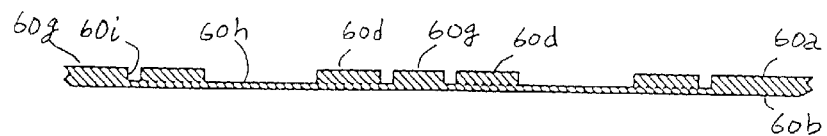
FIGS. 4B and 4C are sectional views taken along the line IVb—IVb indicated by the arrows and the line IVc—IVc indicated by the arrows respectively shown in FIG. 4A.
Figure 4C:
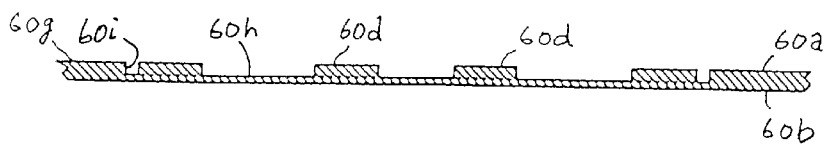

To obtain a so-called multi-tip-package semiconductor device in which two semiconductor chips having the same function and heating value are simultaneously sealed with one resin, it is also preferable that a periphery 60i of the concave part 60h is provided as indicated by one-dot line in FIG. 4A to use a lead frame having a sectional view shown in FIG. 4C. In such a modification, the same function and advantage as the foregoing are also exhibited.

Figure 5A:
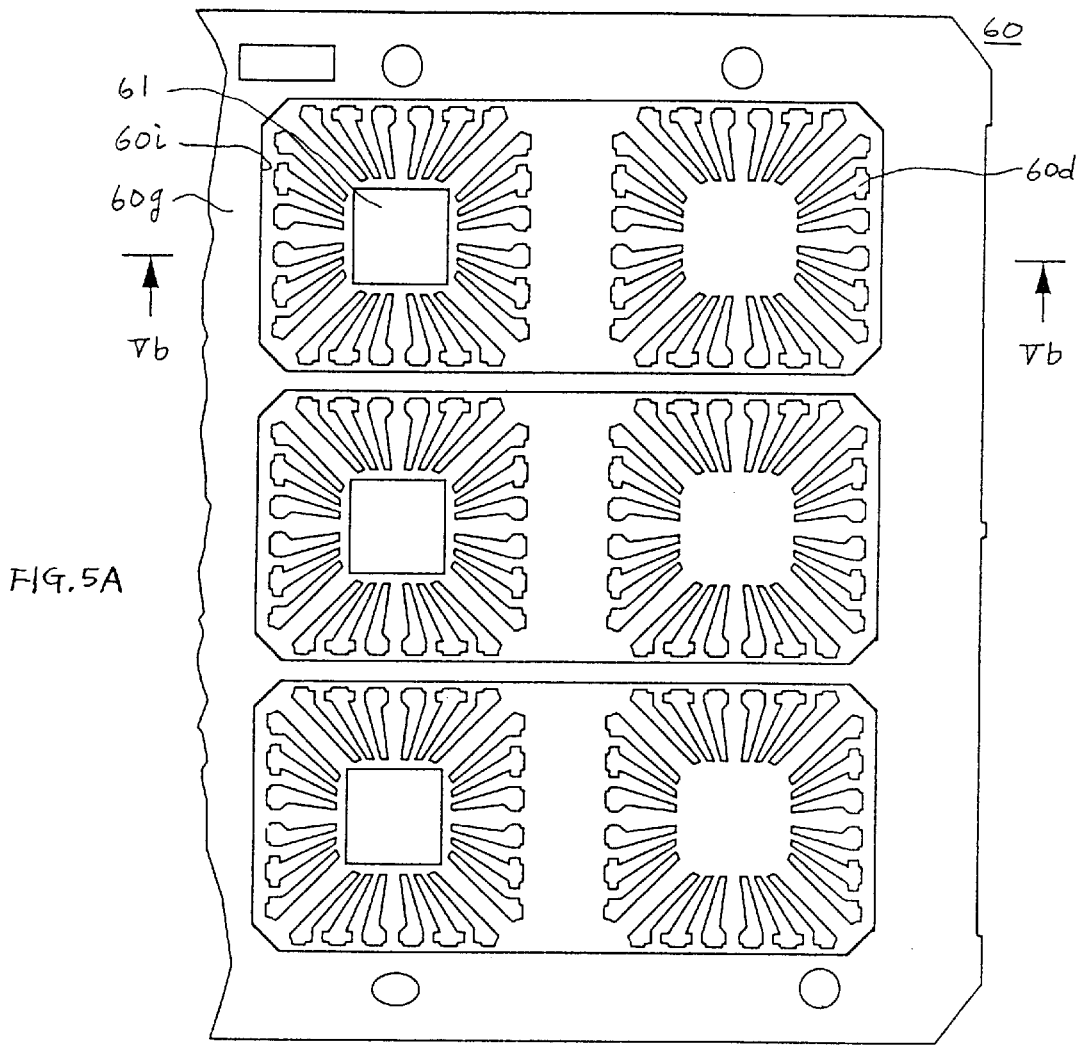
FIG. 5A is a plan view of the lead frame used as a further wiring base member according to the first preferred embodiment of the invention.
Figure 5B:
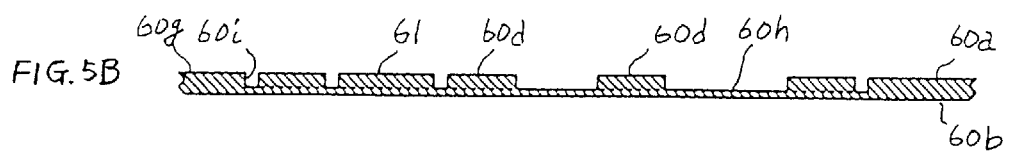
FIG. 5B is a sectional view taken along the line Vb—Vb indicated by the arrows shown in FIG. 5A.

To obtain a so-called multi-tip-package semiconductor device in which a semiconductor chip for power of a high heating value and another semiconductor chip of a small heating value are simultaneously sealed with one resin, as shown in FIGS. 5A and 5B, it is also preferable that a radiation member 61 is provided in the region where the semiconductor chip for power of a high heating value is mounted. In such a modification, the same function and advantage as the foregoing are also exhibited.

Note that the same reference numerals shown in FIGS. 1 and 2 are designated to like parts shown in FIGS. 4 and 5, and any further description thereof is omitted herein.

A semiconductor device according to a second preferred embodiment of the present invention and a manufacturing method thereof are hereinafter described.

Figure 6A:
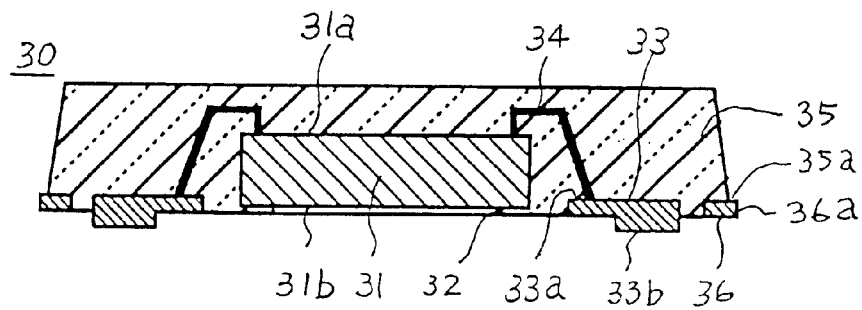
FIG. 6A is a sectional view showing an arrangement of a semiconductor device using a lead frame as a wiring base member according to a second preferred embodiment of the invention.
Figure 6B:
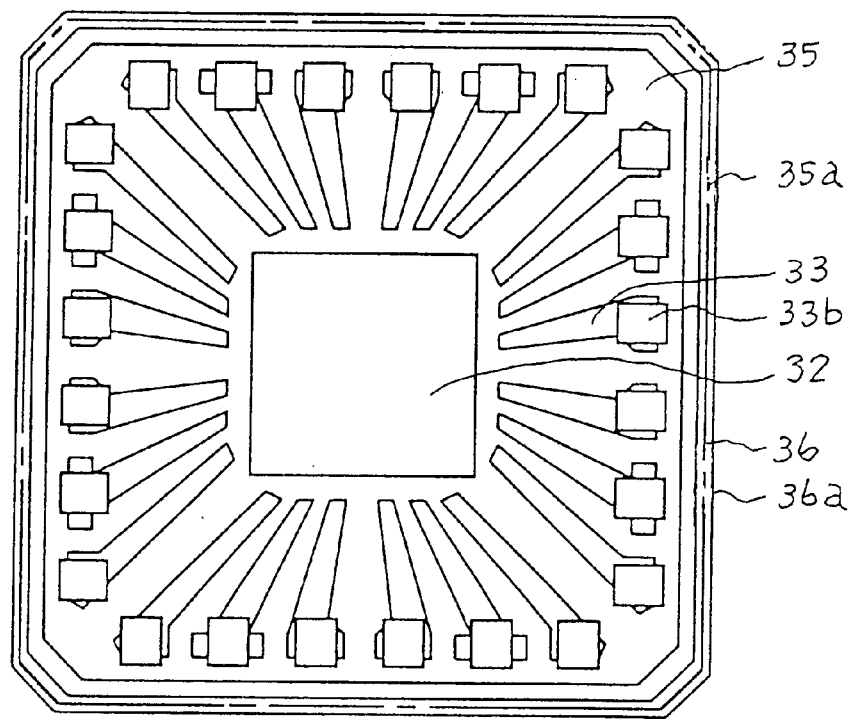
FIG. 6B is a bottom view of the semiconductor device shown in FIG. 6A.
Figure 7A:
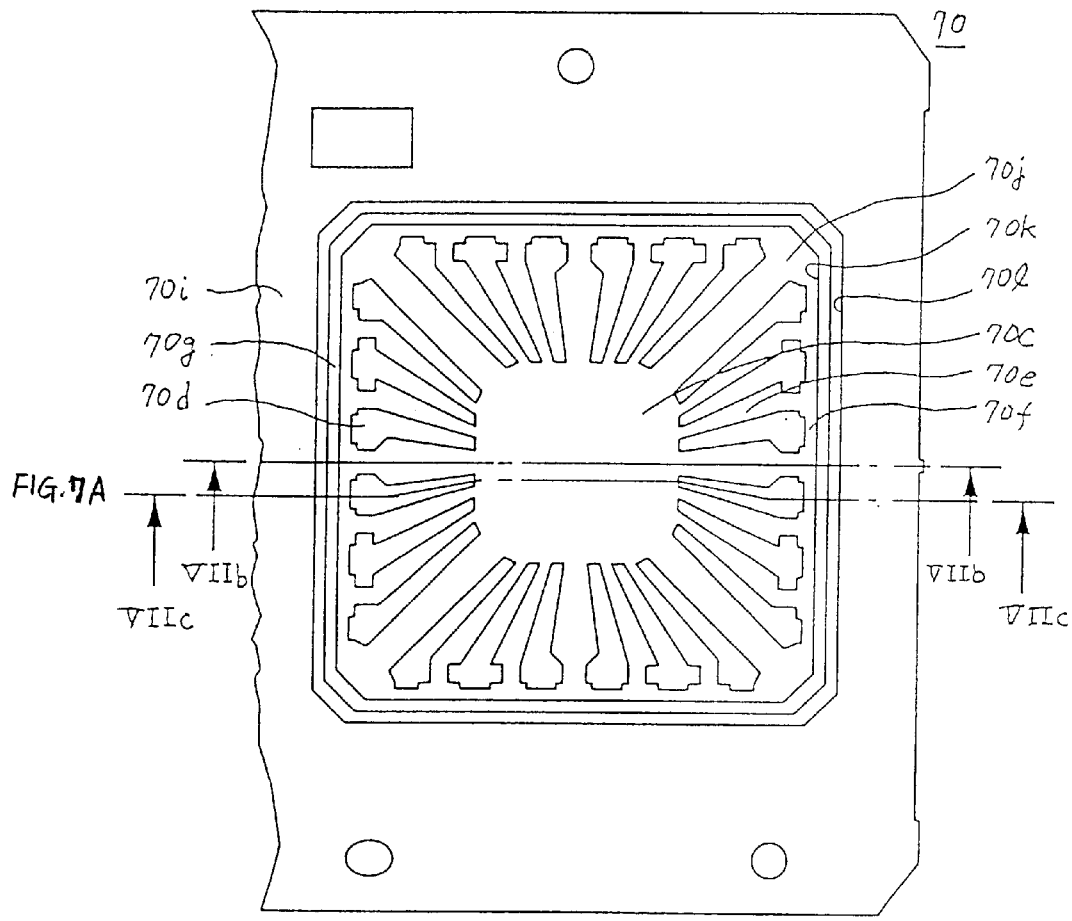
FIG. 7A is a plan view of a lead frame used as a wiring base member according to the second preferred embodiment of the invention.
Figure 7B:
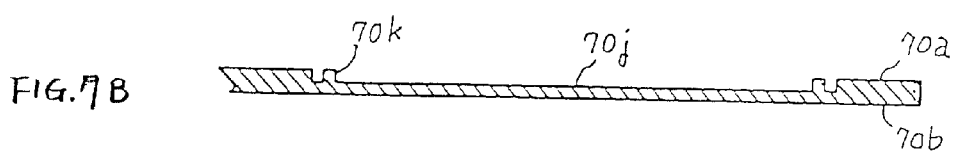
FIG. 7B is a sectional view taken along the line VIIb—VIIb indicated by the arrows in FIG. 7A.
Figure 7C:
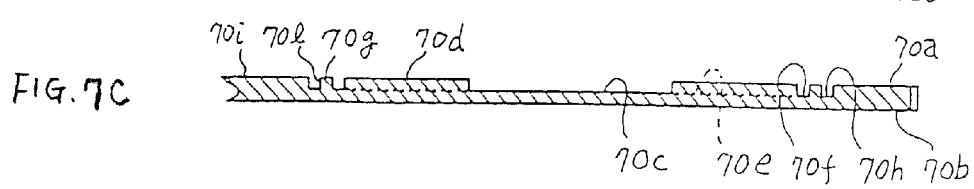
FIG. 7C is a sectional view taken along the line VIIc—VIIc indicated by the arrows in FIG. 7A.

FIG. 6A is a sectional view showing a construction of a semiconductor device according to the second preferred embodiment of the present invention, and FIG. 6B is a bottom view of the semiconductor device shown in FIG. 6A. FIG. 7A is a plan view of a lead frame arranged in a single line and used as a wiring base member according to the second preferred embodiment of the present invention. FIG. 7B is a sectional view taken along the line VIIb—VIIb indicated by the arrows in FIG. 7A. FIG. 7C is a sectional view taken along the line VIIc—VIIc indicated by the arrows in FIG. 7A.

Configuration of the lead frame 70 is hereinafter described. As shown in FIGS. 7A, 7B and 7C, the lead frame 70 composed of a plate-like body having an uneven upper surface 70a and a plain under surface 70b. This plate-like body includes a first thin portion 70c for mounting a semiconductor chip 31 provided with a plurality of pad electrodes, a plurality of first thick portions 70d provided around the first thin portion 70c for forming lead electrodes 33 respectively arranged corresponding to the pad electrodes of the semiconductor chip 31, a second thin portion 70e provided between one of the plurality of first thick portions 70d and another, a third thin portion 70f provided for surrounding the plurality of first thick portions 70d, a second thick portion 70g provided around the third thin portion 70f to form an auxiliary electrode 36, a fourth thin portion 70h provided around the second thick portion 70g, and a third thick portion 70i provided around the fourth thin portion 70h.

Further, the first thin portion 70c, the second thin portion 70e, the third thin portion 70f and the fourth thin portion 70h have substantially the same thickness. Those thin portions 70c, 70e, and 70f form a concave part 70j having a peripheral portion 70k. The thick portions 70d, 70g and 70i form a projecting part.

Using such a lead frame 70, a semiconductor device 30 shown in FIGS. 6A and 6B is obtained. The semiconductor device 30 has an upper surface 31a and an under surface 31b, and in which the semiconductor chip 31 having the plurality of pad electrodes not shown is mounted on the first thin portion 70c of the lead frame 70 not shown through a junction material 32. The plurality of lead electrodes 33 extending peripherally on the under surface 31b side of the semiconductor chip 31 are arranged corresponding to the plurality of pad electrodes. A connecting lead 34 serving as connecting means makes a connection between the plurality of pad electrodes and the plurality of lead electrodes 33. Each of the plurality of lead electrodes 33 includes a thin internal lead portion 33a having a connection part to the connecting lead 34 on the upper surface side, and a thick external electrode portion 33b protruding toward the under surface and forming a connection part to outside. The auxiliary electrode 36 provided around the plurality of lead electrodes 33 is connected to the lead electrodes 33 or to the pad electrodes through a connecting member not shown. This auxiliary electrode is used in power source layer, grounding layer, neutral layer, etc., when required.

The semiconductor chip 31, the lead electrodes 33, the connecting lead 34 and the auxiliary electrode 36 are integrally sealed with a seal resin layer 35. This seal resin layer 35 has an underside which forms substantially the same surface as the under surface of the internal lead portion 33a of the lead electrodes 33 and that of the auxiliary electrode 36. The external electrode portion 33b protrudes downward from the underside of the seal resin layer 35. In the case of BGA type semiconductor device, a conductive ball not shown is mounted on the external electrode portion 33b.

In the lead frame 70 not shown, the thin portion of the lead frame is removed by etching as described hereinafter, and finally the lead frame 70 is separated at the peripheral portion 70l of the second thick portion 70g provided for forming the auxiliary electrode 36. Thus, the semiconductor device 30 shown in FIGS. 6A and 6B is obtained.

Figure 8A:
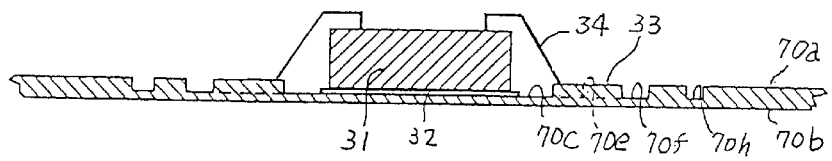
FIGS. 8A to 8D are explanatory views showing a manufacturing method of the semiconductor device using a lead frame as a wiring base member according to the second preferred embodiment of the invention.
Figure 8B:
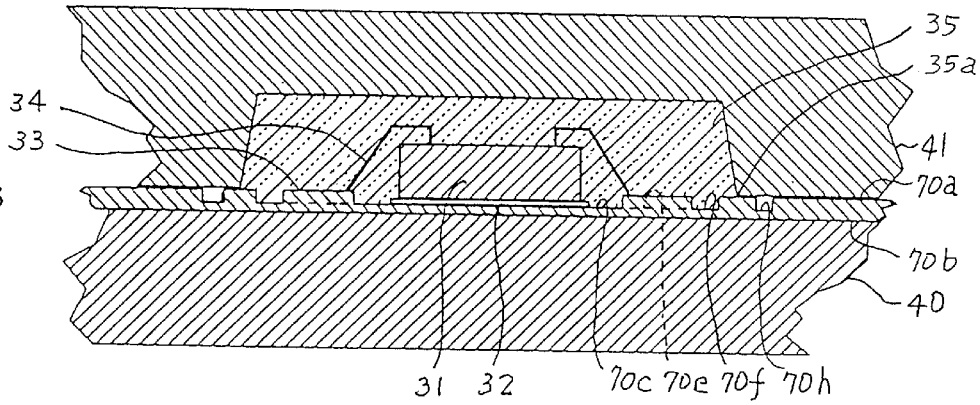
Figure 8C:
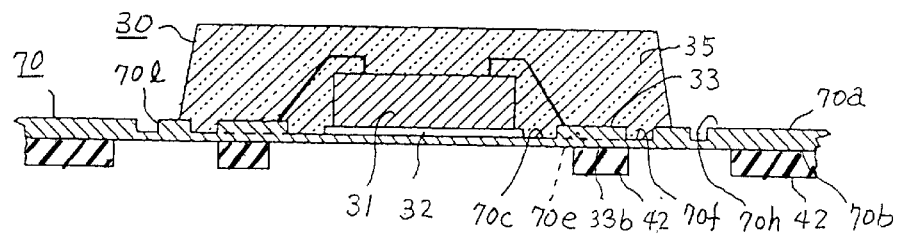
Figure 8D:
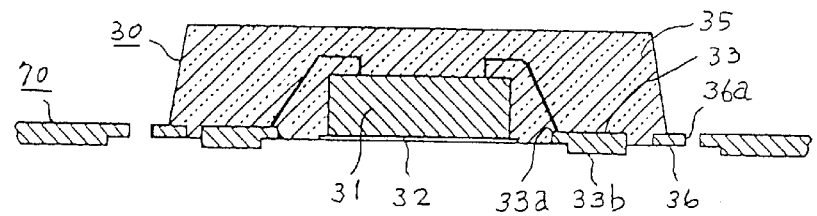
Figure 9A:
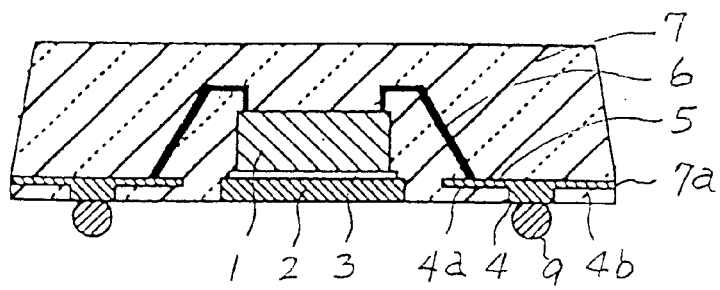
FIG. 9A is a sectional view showing an arrangement of a conventional BGA type semiconductor device using a lead frame as a wiring base member.
Figure 9B:
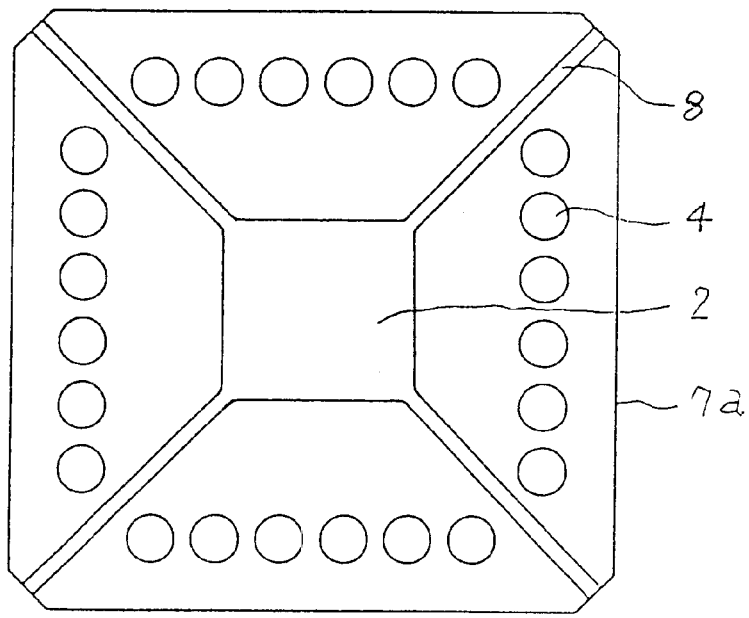
FIG. 9B is a bottom view of the semiconductor device shown in FIG. 9A.
Figure 10A:
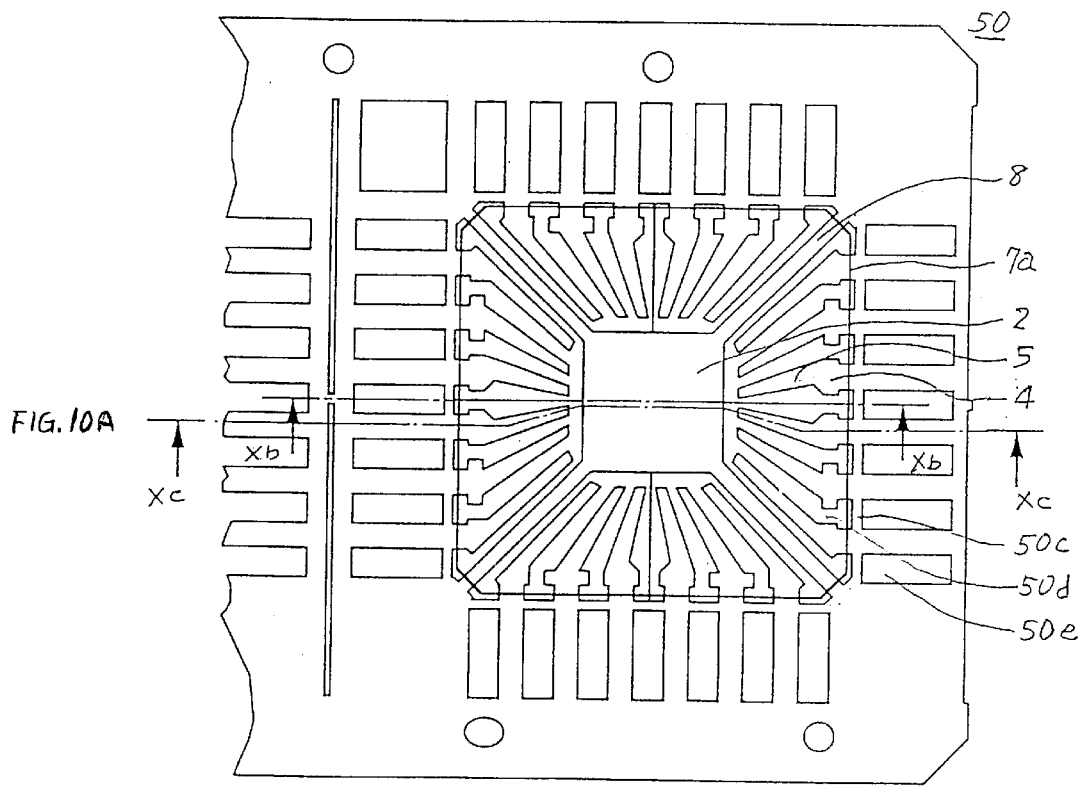
FIG. 10A is a plan view showing a lead frame used in the conventional BGA type semiconductor device.
Figure 10B:
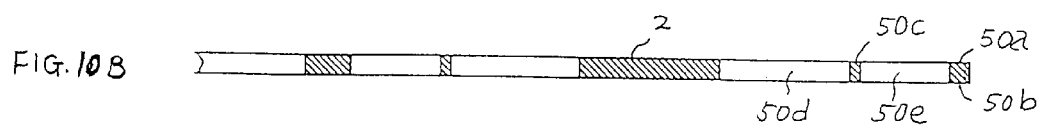
FIG. 10B is a sectional view taken along the line Xb—Xb indicated by the arrows in FIG. 10A.
Figure 10C:
FIG. 10C is a sectional view taken along the line Xc—Xc indicated by the arrows in FIG. 10A.
Figure 11A:
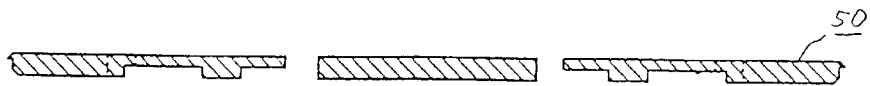
FIGS. 11A to 11C are explanatory views showing a manufacturing method of the conventional BGA type semiconductor device using a lead frame as a wiring base member.
Figure 11B:
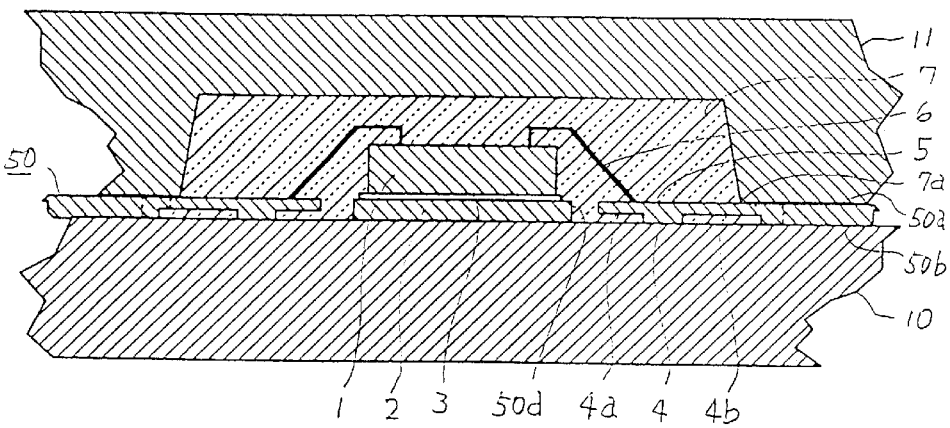
Figure 11C:
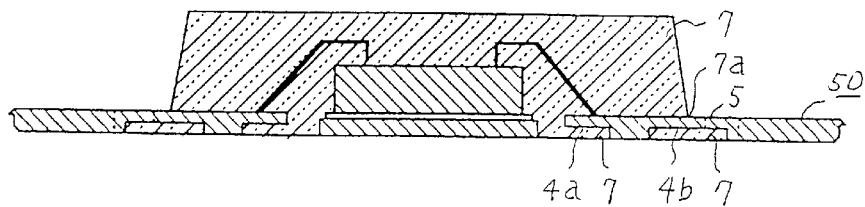

Now, a method of manufacturing the semiconductor device is described with reference to FIGS. 6 to 8. FIGS. 8A to 8D are explanatory views showing a manufacturing method of the semiconductor device using a lead frame as a wiring base member according to the second preferred embodiment of the present invention. FIG. 8A is a sectional view showing a state that a semiconductor chip mounted on the lead frame formed with a thin portion, a lead electrode and an auxiliary electrode is electrically connected to the lead electrode. FIG. 8B is a sectional view showing a state that an upper mold and a lower mold are applied to seal with a resin layer. FIG. 8C is a sectional view showing a state that a resist film for etching is applied to form an external electrode portion. FIG. 8D is a sectional view showing a state that the external electrode portion is protruded by etching.

First, by applying a half etching to the upper surface 70a of the lead frame 70, after forming a resist film not shown and patterning it as shown in FIG. 7A, a plate-like body provided with the uneven upper surface 70a and the plain under surface 70b is formed. More specifically, the first thin portion 70c for mounting the semiconductor chip 31 provided with the plurality of pad electrodes not shown, the plurality of first thick portions 70d provided around the first thin portion 70c for forming the lead electrodes 33 respectively arranged corresponding to the pad electrodes of the semiconductor chip 31, the second thin portion 70e provided between one of the plurality of first thick portions 70d and another, the third thin portion 70f provided for surrounding the plurality of first thick portions 70d, the second thick portion 70g provided around the third thin portion 70f to form the auxiliary electrode 36, the fourth thin portion 70h provided around the second thick portion 70g, and the third thick portion 70i provided around the fourth thin portion 70h are formed.

Further, the first thin portion 70c, the second thin portion 70e, the third thin portion 70f and the fourth thin portion 70h have substantially the same thickness. Those thin portions 70c, 70e, 70f and 70h form a concave part 70j. The thick portions 70d, 70g and 70i form a plate-like body provided with the uneven upper surface 70a and the plain under surface 70b.

The peripheral portion 36a of the auxiliary electrode 36 is formed either to be larger than a resin seal line 35a, for example, to be larger by a depth of the concave part 70j or to be coincident with the resin seal line 35a, so that a later-described upper mold 41 is easily positioned.

Then, as shown in FIG. 8A, by applying a junction material 32 composed of epoxy resin, epoxy resin with silver, adhesive tape, solder or the like to the central part of the first thin portion 70c, the semiconductor chip 31 is put together (junction step).

Thereafter, the semiconductor chip 31 is connected to the lead electrodes 33 using the connecting lead 34 composed of gold wire, aluminum wire or the like (connection step).

Then, as shown in FIG. 8B, the under surface 70b of the lead frame 70 of which junction step and connection step have been completed is mounted on the lower mold 40. Then, the upper mold 41 is positioned to the resin seal line 35a and mounted on the upper surface 70a of the lead frame 70. After tightening the two molds 40 and 41, the thermosetting seal resin layer 35 composed of epoxy resin, phenol resin or the like is transformed to a liquid of a low viscosity and injected with a high pressure by transfer molding (sealing step).

At this time, the under surface 70b side of the lead frame 70 being integrated with the thin portions 70c, 70e, 70f and 70h comes entirely in contact with the lower mold 40, and the seal resin layer 35 is shut off by the thin portions 70c, 70e, 70f and 70h. Therefore, the seal rein layer 35 does not flow in the contact surface between the under surface 70b of the lead frame 70 and the lower mold 70. As a result, it is possible to prevent a formation of thin burr.

After the sealing step, the two molds 40 and 41 are removed. And as shown in FIG. 8C, on the under surface 70b of the lead frame 70, a masking with a resist film 42 is applied to a part where the external electrode portion 33b is formed and to a part surrounding the outside of the fourth thin portion 70h. Then, the under surface 70b of the lead frame 70 except the portions applied with the resin film 32, is removed by half etching up to the same surface as the under surface of the seal resin layer 35. As a result, as shown in FIG. 8D, the junction material 32 is exposed, and the plurality of lead electrodes 33 protrude respectively toward the under surface. Thus, the thick external electrode portion 33b serving as a connection part to outside is formed on the underside of the lead electrodes 33 (formation step of external electrode portion).

That is, the semiconductor chip 31, the lead electrodes 33 and the connecting lead 34 are integrally sealed with the seal resin layer 35. This seal resin layer 35 is arranged so that its underside forms substantially the same surface as the under surface of the internal lead portion 33a of the lead electrodes 33 and that of the auxiliary electrode 36, and the external electrode portion 33b protrudes downward from the underside of the seal resin layer 35. The lead frame 70 and the semiconductor device 30 are connected at the area where the peripheral portion 36a of the auxiliary electrode 36 is located. Thus, the semiconductor device 30 is inevitably separated from the lead frame 70 (separation step).

As a result, it is possible to separate easily the semiconductor device 30 and the lead frame 70 without using any cutter, and it is further possible to prevent the separated portion of the seal resin layer 35 of the semiconductor device 30 from being a complicated crushed configuration.

Even if the seal resin layer 35 gets out of the resin seal line 35a of the upper mold 41 to the surface of the auxiliary electrode 36 and a thin burr is formed there, any further leakage is inhibited at the peripheral portion 36a of the auxiliary electrode 36, and there is no drop of the burr. As a result, a semiconductor device of high quality can be achieved, and it is possible for the auxiliary electrode 36 to protect the periphery of the under surface of the semiconductor device 30.

Further, the semiconductor device obtained after this separation step can be built in a thin and small apparatus such as cellular phone to serve as a non lead type semiconductor device.

On the under surface side of the semiconductor device 30, the external electrode 33b protrudes downward from the underside of the seal resin layer. Therefore, even if a curvature is produced due to difference in coefficient of thermal expansion of the components of the semiconductor device, it is possible to obtain a desirable contact surface in the electrical connection between the external electrode portion 33b and other board.

Even if there is a curvature in the other board in addition to the curvature produced in the semiconductor device 30 itself, the external electrode portion 33b comes exactly in contact with the other board without fail, and there is no insufficient contact.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A lead frame for a semiconductor device comprising:
   a plate having a non-planar upper surface and a planar under surface, said plate comprising:
   a first relatively thin portion for mounting a semiconductor chip having a plurality of pad electrodes;
   a plurality of first relatively thick portions radially arranged around said first relatively thin portion for forming lead electrodes respectively corresponding to the pad electrodes of the semiconductor chip;
   a second relatively thin portion located between pairs of said plurality of first relatively thick portions;
   a third relatively thin portion peripherally surrounding said plurality of first relatively thick portions; and
   a second relatively thick portion surrounding said third relatively thin portion, said first, second, and third relatively thin portions being thinner than said first and second relatively thick portions wherein said plate is a solid continuous body, free of holes, in a region surrounded by the third relatively thin portion.

2. The lead frame for a semiconductor device according to claim 1, wherein said first, second, and third thin portions have substantially the same thickness.

3. The lead frame for a semiconductor device according to claim 1, wherein said plate is a solid continuous body, free of holes, in a region surrounded by said third relatively thin portion.

4. The lead frame for a semiconductor device according to claim 3, wherein the plurality of first relatively thick portions have respective lengths radially extending towards the first relatively thin portion, and said second relatively thin portion continuously extends between pairs of adjacent first relatively thick portions, continuously joining all of the lengths of the adjacent pairs of said first relatively thick portions.

5. A lead frame for a semiconductor device comprising:
   a plate having a non-planar upper surface and a planar under surface, said plate comprising:
   a first relatively thin portion for mounting a semiconductor chip including a plurality of pad electrodes;
   a plurality of first relatively thick portions radially arranged around said first relatively thin portion to form lead electrodes respectively corresponding to the pad electrodes of the semiconductor chip;
   a second relatively thin portion located between pairs of said plurality of first relatively thick portions;
   a third relatively thin portion peripherally surrounding said plurality of first relatively thick portions;
   a second relatively thick portion surrounding said third relatively thin portion to form an auxiliary electrode;
   a fourth relatively thin portion surrounding said second relatively thick portion; and
   a third relatively thick portion surrounding said fourth relatively thin portion, said first, second, third, and fourth relatively thin portions being thinner than said first, second, and third relatively thick portions.

6. The lead frame for a semiconductor device according to claim 5, wherein said first, second, third, and fourth thin portions have substantially the same thickness.

7. The lead frame for a semiconductor device according to claim 5, wherein said plate is a solid continuous body, free of holes, in a region surrounded by said fourth relatively thin portion.

8. The lead frame for a semiconductor device according to claim 7, wherein the plurality of first relatively thick portions have respective lengths radially extending towards the first relatively thin portion, and said second relatively thin portion continuously extends between pairs of adjacent first relatively thick portions, continuously joining all of the lengths of the adjacent pairs of said first relatively thick portions.

\* \* \* \* \*